United States Patent
Yap et al.

(10) Patent No.: US 8,352,899 B1
(45) Date of Patent: Jan. 8, 2013

(54) METHOD TO MODIFY AN INTEGRATED CIRCUIT (IC) DESIGN

(75) Inventors: Kian Chin Yap, Lebuh Relai (MY); Phooi Choong Loh, Menglembu (MY); Kar Keng Chua, Juru (MY)

(73) Assignee: Altera Corporation, San Jose, CA (US)

( * ) Notice: Subject to any disclaimer, the term of this patent is extended or adjusted under 35 U.S.C. 154(b) by 328 days.

(21) Appl. No.: 12/860,662

(22) Filed: Aug. 20, 2010

(51) Int. Cl.
*G06F 17/50* (2006.01)

(52) U.S. Cl. .......................... 716/132; 716/103; 716/126

(58) Field of Classification Search .................. None
See application file for complete search history.

(56) References Cited

U.S. PATENT DOCUMENTS

| | | | |
|---|---|---|---|
| 6,490,707 B1 * | 12/2002 | Baxter ........................... | 716/117 |
| 7,093,225 B2 * | 8/2006 | Osann, Jr. ..................... | 438/129 |
| 7,310,787 B2 * | 12/2007 | Prakash et al. ................ | 716/102 |
| 7,328,421 B1 * | 2/2008 | Ballagh et al. ................ | 716/103 |
| 7,343,570 B2 * | 3/2008 | Bowers et al. ................ | 716/121 |
| 7,406,668 B1 * | 7/2008 | Pedersen et al. .............. | 716/103 |
| 7,631,284 B1 * | 12/2009 | Perry et al. .................... | 716/138 |
| 7,703,065 B2 * | 4/2010 | Osann, Jr. ...................... | 716/128 |
| 8,151,237 B2 * | 4/2012 | Ali et al. ........................ | 716/126 |

* cited by examiner

*Primary Examiner* — Leigh Garbowski
(74) *Attorney, Agent, or Firm* — Womble Carlyle Sandridge & Rice, LLP

(57) ABSTRACT

A method to modify a first IC design into a second IC design, the first and second IC designs specifying a common interconnection layer with a plurality of interconnections, is disclosed. The method includes identifying an interconnection from plurality of interconnections within the common interconnection layer. The interconnection is unused for routing signals in the first IC design. The metal layer that is coupled with the identified interconnection is removed from the first IC design to generate a modified design. The identified interconnection of the first IC design is placed into one of an invisible state or a temporarily removed state in the modified design. The metal layer in the modified design is routed for a specific logic gate design. The modified design is then stored as the second IC design.

21 Claims, 11 Drawing Sheets

METHOD TO MODIFY AN INTEGRATED CIRCUIT (IC) DESIGN

BACKGROUND

An IC device is a miniaturized electronic circuit network that is built on a surface of a substrate, such as semiconductor materials, using a photolithography process. The IC device is designed using an IC design process before the IC is manufactured. The IC design process, encompassing particular logic and circuit design techniques, is a complicated process that includes multiple design stages. Each of the IC design stages needs to come together harmoniously to obtain logical correctness, maximum circuit density and optimized circuit placement with an expected timing specification. Examples of IC design stages include a feasibility study, a functional study, a Register Transfer Level (RTL) design, a layout creation, a timing analysis, etc.

An IC layout represents the IC device with geometric shapes that correspond to patterns of metal, oxide or semiconductor layers that form components in the IC device. The layout process includes the design of transistors, the placement of the transistors on a substrate, the placement of metal routings on metal layers that connect circuits, and the placement of vias on via layers that interconnect the metal layers. All the abovementioned layout process steps adhere to semiconductor process design rules provided by a wafer fabrication facility.

An exemplary IC design process includes creating a prototype design circuit on a programmable IC device and then converting the prototype circuit design into a non-programmable IC device, such as Application Specific Integrated Circuit (ASIC). The non-programmable IC device is typically not used as a prototyping vehicle because of the difficulties in estimating the timing variations and semiconductor process limitations during the design phase. Such issues are not readily fixable on a non-programmable IC as compared to a programmable IC, for which a redesign can be performed. However, a non-programmable IC is preferred as a final product due to cost considerations. Moving from a programmable IC design to a non-programmable IC design requires many design steps, such as another layout and timing analysis of the IC design, so that the differences between the programmable IC design and non-programmable IC design can be eliminated. These design steps can incur increased costs but are necessary to ensure proper performance.

It is within this context that the embodiments described herein arise.

SUMMARY

Embodiments of the present invention provide a method to modify an IC design with a fixed via layer.

It should be appreciated that the present invention can be implemented in numerous ways, such as a process, an apparatus, a system, a device, or a method. Several inventive embodiments of the present invention are described below.

In one embodiment, a method to modify a first IC design into a second IC design, where the first and second IC designs have a common via layer, is provided. The method includes identifying a via in a via layer that is not used for routing signals for the second design. The entire customizable metal layer connected to the identified via is removed from the IC design. The identified via is then placed into an invisible state or a temporarily removed state and consequently is not treated as a blockage by the place and route design tool. The place and route design tool described herein creates a metal layer with metal routings to replace the removed metal layer. The place and route design tool routes the metal layer according to the expected logic gate design as needed by the second design. Once the metal layer is designed, the identified via is removed from the invisible state or the temporarily removed state. The design is then stored for manufacturing. In one embodiment, a portion of the metal layer connected to an unutilized via is removed from the customizable layer. The remaining portion of the metal layer is then rerouted to provide a logic gate design. The metal layer rerouting is based on one of route-through, adjacent route or island port techniques. The modifying of the IC design and rerouting of the metal layer described herein minimizes the number of masks required for fabrication during the modification from the first IC design to the second IC design.

In another embodiment, a method to migrate between IC designs, where each of the IC designs has an equal number of fixed ports, is provided. The method includes identifying a routing path in a customizable metal layer for a gate design in one of the IC designs. The method then advances to identifying an unutilized via that is not routing signals, but instead blocking the routing path in the metal layer for the gate design. The identified via is placed into an invisible state or a temporarily removed state in order to avoid any blockages caused by the metal layer during the place and route design phase. A portion of the metal layer connected with the identified via is removed from the IC design. The place and route design tool reroutes the remaining portion of the metal layer to create routing paths according to the gate design. The method is executed through a processor and the resulting design is stored for manufacturing.

Other aspects of the invention will become apparent from the following detailed description, taken in conjunction with the accompanying drawings, illustrating by way of example of the principle of the invention.

BRIEF DESCRIPTION OF THE DRAWINGS

The invention may be understood by reference to the following description taken in conjunction with the accompanying drawings in which.

DETAILED DESCRIPTION

The following embodiments describe a method to modify an IC design.

It will be obvious, however, to one skilled in the art, that the present invention may be practiced without some or all of these specific details. In other instances, well-known operations have not been described in detail in order not to unnecessarily obscure the present invention.

Embodiments of present invention entail a method to modify functionality of an IC design that has a fixed interconnection layer. The method described herein enables a reduction of the number of masks needed to be redesigned during an IC fabrication when migrating from one design to another design. This reduction reduces the cost associated with designing and producing the IC. The embodiments also entail structures resulting from the method.

Figure 1:
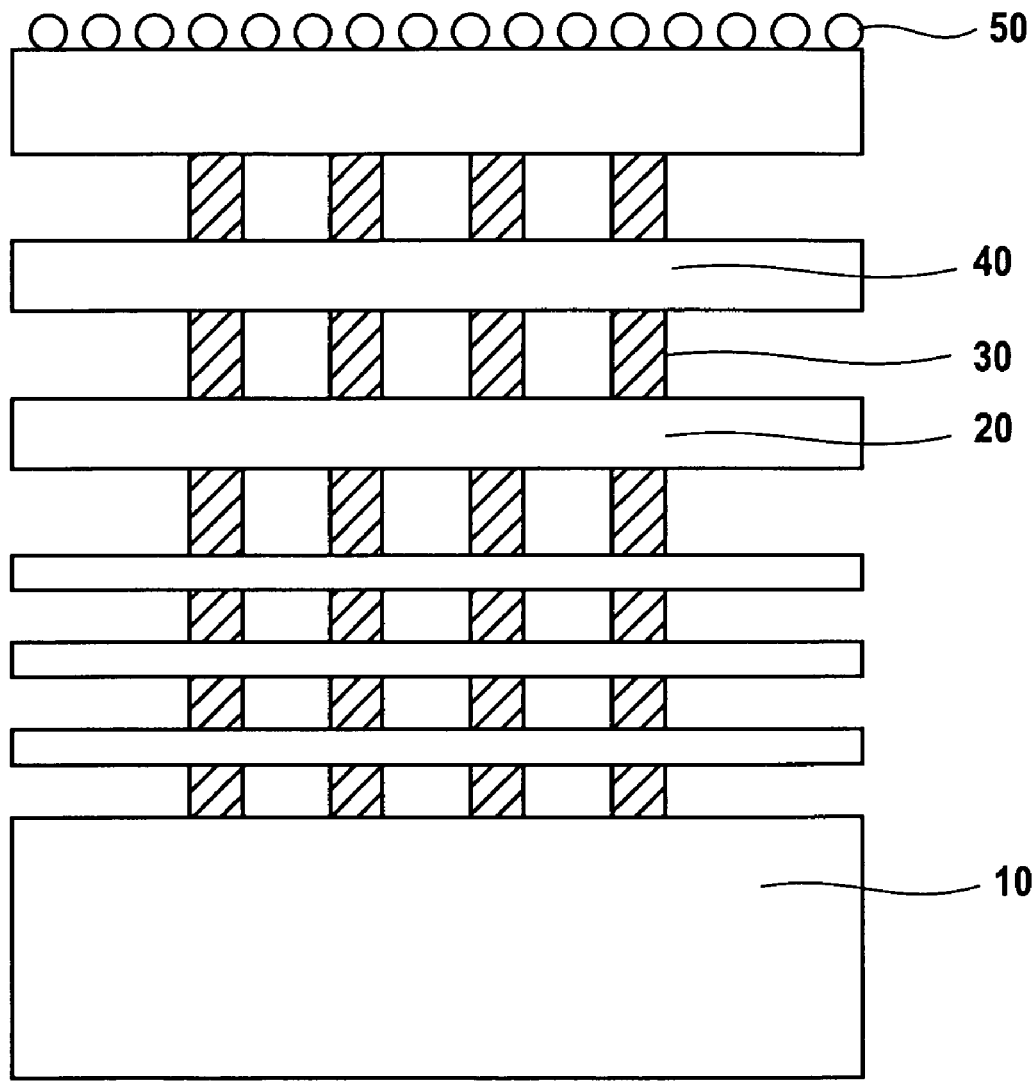
FIG. 1, meant to be illustrative and not limiting, illustrates a cross-sectional view of an IC in accordance with one embodiment of the invention.

FIG. 1, meant to be illustrative and not limiting, illustrates a cross-sectional view of an IC in accordance with one embodiment. The IC includes a substrate layer 10, a lower metal layer 20, an interconnection layer 30, an upper metal layer 40, and a bump layer 50. The substrate layer 10 typically is a semiconductor material such as silicon or germanium arsenide upon which transistors are formed. The lower metal layer 20 and the upper metal layer 40 are connected through the interconnection layer 30. Both lower and upper metal layers 20 and 40 include plurality of metal routings. The plurality of metal routings routes signals a) from an external source to a circuitry of the IC, b) between circuitries within the IC, or c) from a circuitry in the IC to an external destination. The interconnection layer 30 includes a plurality of interconnections. The interconnections are typically conductive through hole vias that connect the metal routing of the upper metal layer 40 to the metal routing of the lower metal layer 20. The metal routings, interconnections, and transistors on the substrate collectively form a functional electronic circuit. The bump layer 50 provides electrical connections from the IC to a surrounding package or onto another IC.

Still referring to FIG. 1, a programmable IC, which is typically is an electronic component used to build reconfigurable circuits, and a non-programmable IC, which is typically an electronic component with a fixed functionality, typically have similar cross-sectional layouts. Both of the cross-sectional layouts include a plurality of metal layers and interconnection layers. The programmable IC is programmed to a specific electrical function by a programmable selection of routing signal pathways through the metal routings in the lower metal layer 20 and upper metal layer 40. The unselected routing signal pathways in the lower and upper metal layers 20 and 40 are not used. The programmable IC is modified into the non-programmable IC by specifying a fixed path. Signals on the fixed paths can only route in a specific manner. In one embodiment, the upper metal layer 40 and the lower metal layer 20 are customizable layers having a fixed interconnection layer 30. By modifying the customizable layers, functionality of the IC can be changed to a desired design. By making such modifications permanent, a programmable IC can be used to create a non-programmable IC. As it is known in the art, each metal layer or via layer of the IC is associated with a design mask. Hence, the desired design can be attained by changing the design mask of the customizable layers.

Figure 2:
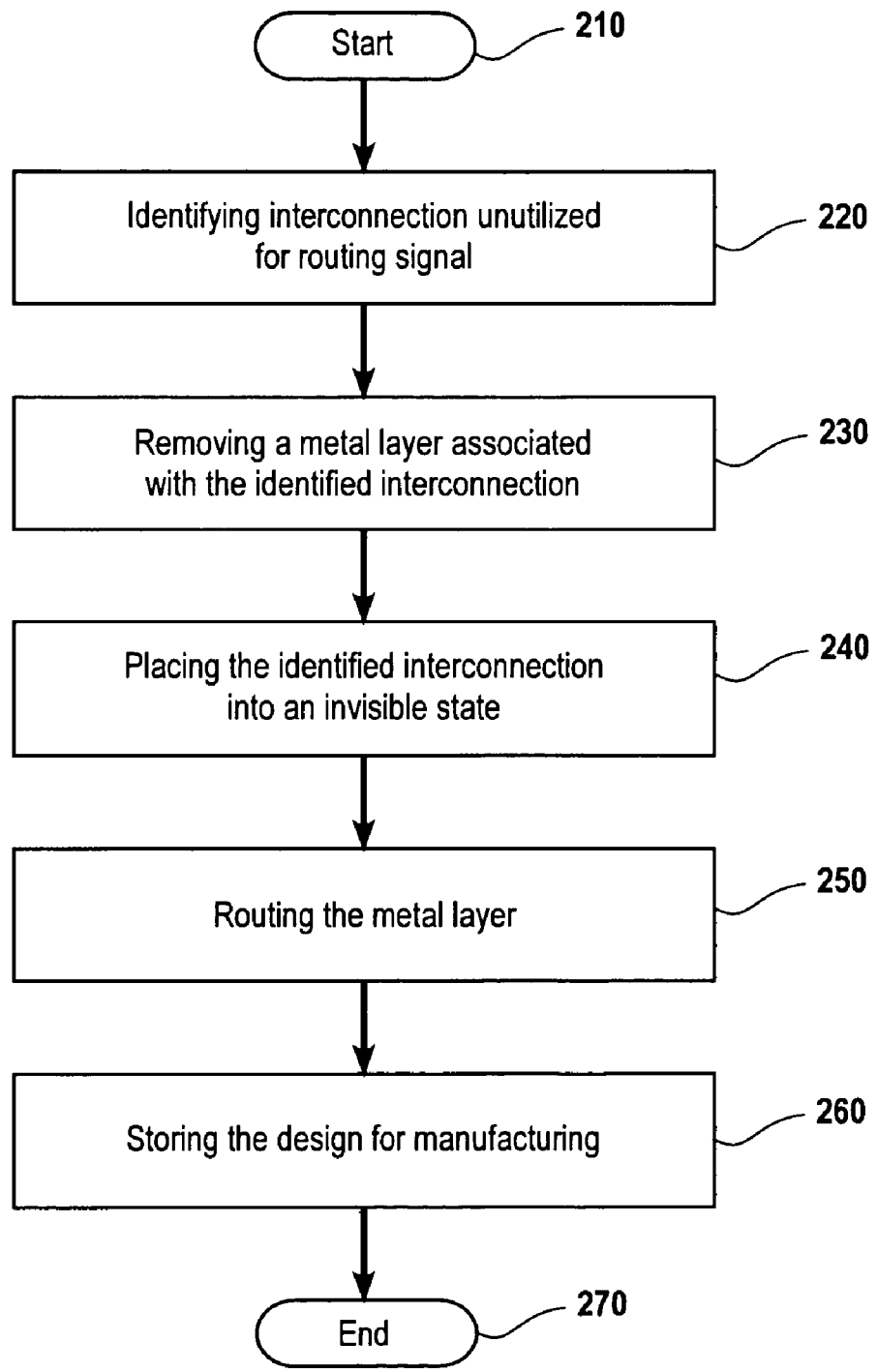
FIG. 2, meant to be illustrative and not limiting, is a flowchart depicting a method to modify a first IC design into a second IC design in accordance with one embodiment of the invention.

FIG. 2, meant to be illustrative and not limiting, illustrates a flow chart of a method to modify a first IC design into a second IC design. The method includes identifying unutilized interconnections for signal routing as shown in operation 220. To obtain a specific logic design for the second IC design, there are portions of interconnections and metal routings in the first IC design that enable such functionality. The remaining portions of interconnections are identified as unutilized for routing signals in second IC design. A metal layer connected with the identified interconnection is removed from the design as shown in operation 230. In one embodiment, the metal layer is a customizable layer in the first and second IC design. The method then proceeds to operation 240, where the identified interconnection is placed into an invisible state or a temporarily removed state, as part of an intermediate modification stage in one embodiment. In another embodiment, the placement of the identified interconnection into either one of the states is done by modifying an IC design database. Placing the interconnection into one of the two states ensures that the identified interconnections will not represent possible blockages during layout designs. A metal layer routed for the specific logic design is inserted into the second IC design replacing the removed metal layer as shown in operation 250. The metal layer is created utilizing place and route (P&R) software. The P&R software takes into consideration the placement of remaining interconnections and the pursued logic design. The P&R software functionality includes (a) considering at least two interconnections that need to be connected through the metal routing for a signal path (b) connecting the considered interconnections through the metal routing (c) considering other metal routings within the same metal layer and other interconnections within an adjacent layer on the metal layer that block the signal path. The final design is then stored as in operation 260. In one embodiment, the method is used for modifying a programmable IC, the first IC design, with customizable layers to a non-programmable IC, the second IC design. The customizable layer in one embodiment is a metal layer with a plurality of metal routings.

Figure 3A:
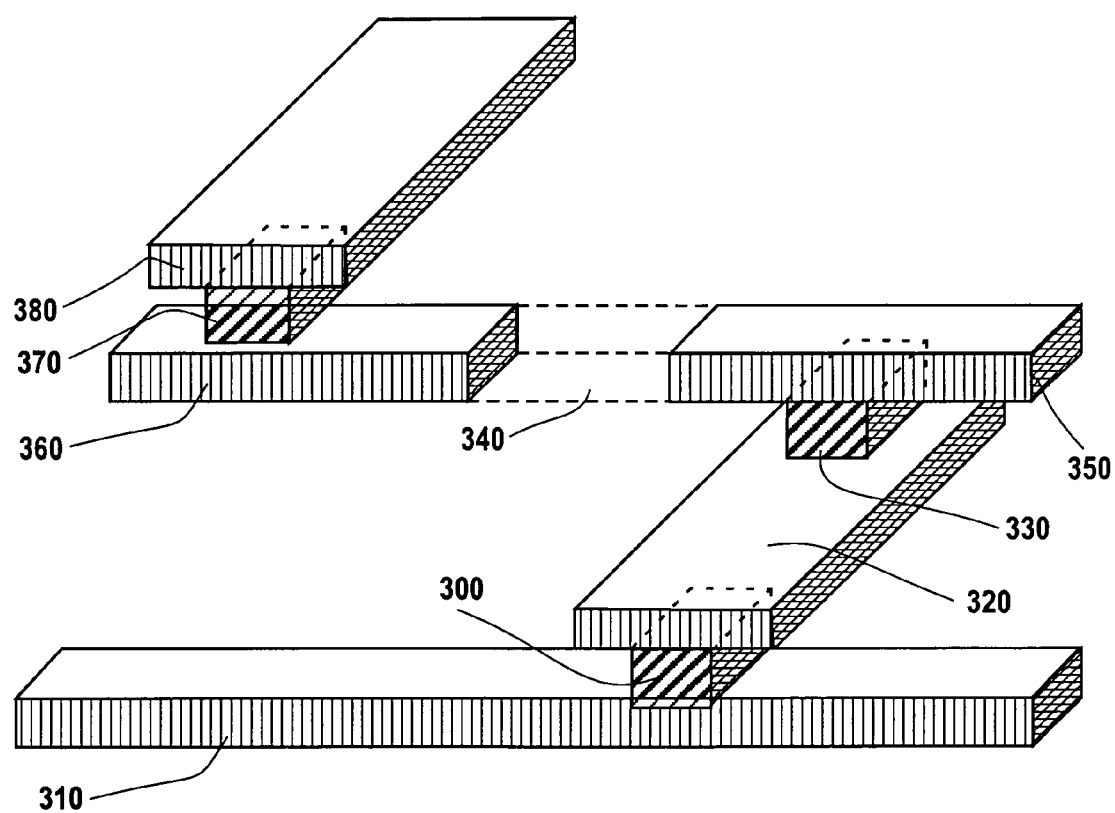
FIG. 3A, meant to be illustrative and not limiting, illustrates a metal routing design within a metal layer blocked by an unutilized interconnection design in accordance with one embodiment of the invention.

FIG. 3A, meant to be illustrative and not limiting, illustrates a metal routing design within a metal layer blocked by an unutilized interconnection design. In one embodiment, metal routings 310 and 320 are located in a lower metal layer of an IC design while metal routings 350, 360 and 380 are located in an upper metal layer. In one embodiment, the metal routing 350 and 360 are in a customizable metal layer. Vias 300, 330 and 370 provide connections from one metal routing to another metal routing located in a different metal layer. The via 300 is located in the customizable layer and the vias 330 and 370 are in a non-customizable layer in one embodiment. Following the described method in FIG. 2, the metal routings and the vias needed to route signals in a specific logic design for a second IC design is identified. The remaining vias are identified as unutilized for signal routing. Accordingly, the via 330 is identified as unutilized for signal routing in the exemplary illustration of FIG. 3A. The metal routing 350 connected to the via 330 is also unutilized for signal routing.

The metal routing 350 becomes a blockage when designing the metal layer. In one embodiment, there is a gap 340 in between the metal routing 350 and the metal routing 360. The metal routings 350 and 360 are located in the customizable layer, and hence can be changed based on a specific logic design. However, the via 330 is in the non-customizable layer and should not be changed. It should be appreciated that utilizing the P&R software, without the embodiments of the invention described herein to generate the metal routing design for the specific logic design, considers via 330 and may create a non-optimized metal routing within the customizable layer.

Figure 3B:
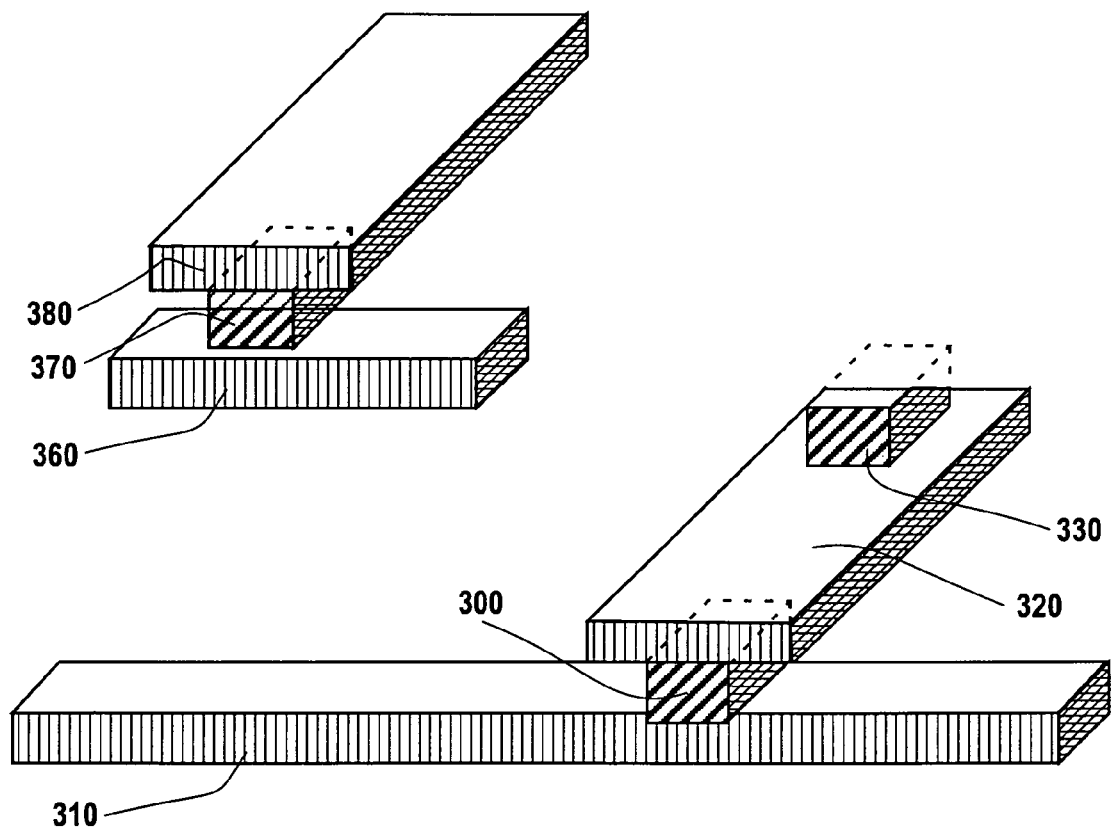
FIG. 3B, meant to be illustrative and not limiting, illustrates metal routing and via designs during an intermediate modification design stage in accordance with one embodiment of the invention.

FIG. 3B, meant to be illustrative and not limiting, illustrates metal routing designs and via designs described in connection with FIG. 3A during an intermediate modification design stage. During the intermediate modification design stage, the via 330 limits optimization of the layout. The via 330 is placed into an invisible state or a temporarily removed state to overcome the limitation. The via 330 is placed into these states by modifying the via status within the IC design database. The invisible state is where the via is still in the IC design database, but does not set any limitations on the P&R software in one embodiment. The temporarily removed state is where the via is removed from the IC design database and, therefore, cannot set any limitations to the P&R software in one embodiment. Once the via 330 is placed into one of the two states, further processing steps in the P&R software ignores the existence of the via 330. In one embodiment, the metal routing 350 within the upper metal layer that is connected to the via 330 is removed. The metal routing 350 is not utilized for routing signals and becomes a blockage to the P&R software when developing an optimized IC design. In another embodiment, the entire upper metal layer that is connected with the via 330 is removed. It should be appreciated that in this embodiment, the entire upper metal layer is redesigned with the specific metal routing designs that take into consideration the via layers located above and below the upper metal layer and with the objective of attaining the specific logic design. The redesigned metal layer will then replace the removed metal layer.

Figure 3C:
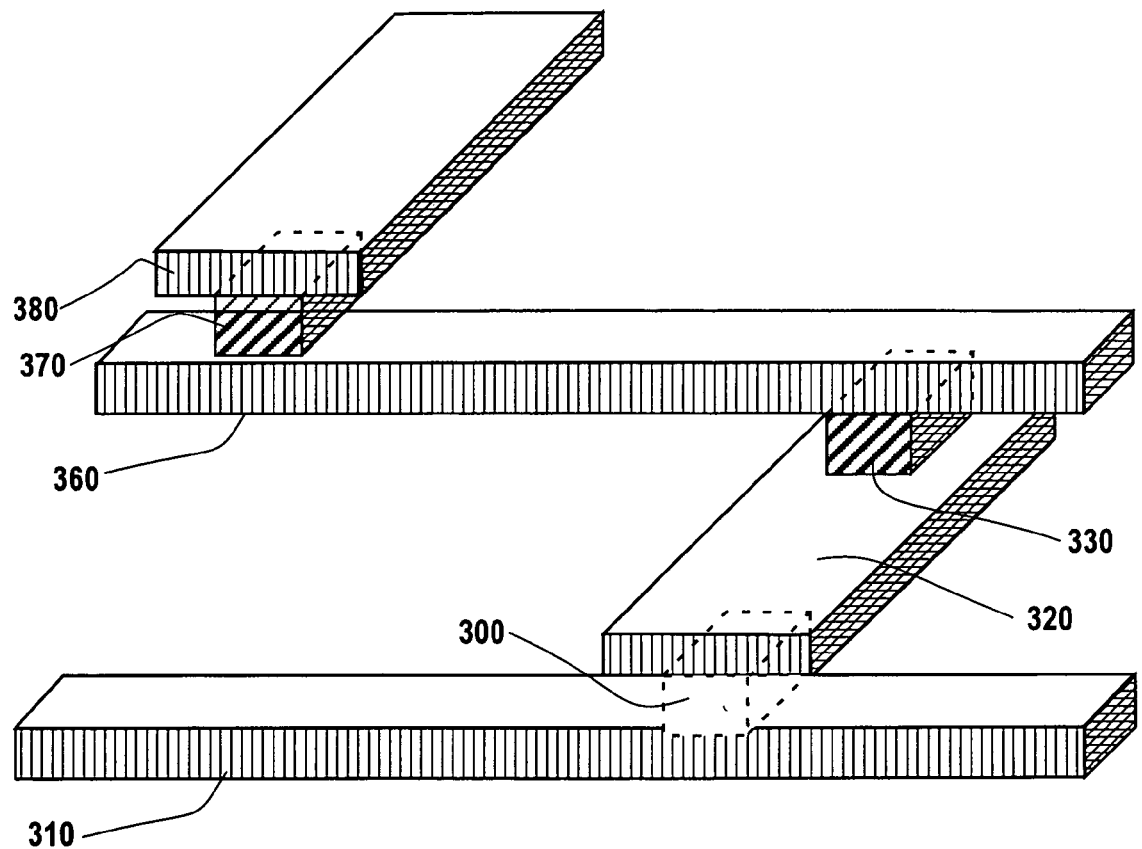
FIG. 3C, meant to be illustrative and not limiting, illustrates metal routings and via designs during final stages of the IC design process in accordance with one embodiment of the invention.

FIG. 3C, meant to be illustrative and not limiting, illustrates metal routings and via designs described in connection with FIG. 3A during a final stage of migration between the IC designs. The metal routing 360 has been routed to and past the via 330, which is used for signal routing, and ultimately provides a signal routing path connecting the vias 300 and 370. The gap 340 as illustrated in FIG. 3A is eliminated in FIG. 3C. The P&R software identifies the upper and the lower via design layers before designing the metal routings in one embodiment. If the via 330 is not placed into one of the two states, then the P&R software prompts a sequence of algorithmic logic to avoid the via 330 during designing of metal routings, as the via 330 is not ignored and is perceived as a blockage. By placing the via 330 into one of the two states, as shown in FIG. 3B, the P&R software will ignore the via 330 and will not take as the blockage during metal routing designing. Hence, the P&R software routes through the via 330 in the metal layer. A path, established from the metal routing 360 to the metal routing 320 through the via 330, could be utilized for routing signals in the IC design. However, because of the desired logic design within the IC, the path is not utilized for routing any signals. Hence, the path is disconnected through the customizable layer in the IC design. In one embodiment, the path is disconnected by removing the via 300 that is located in the customizable layer. Consequently, the metal routing 320 is considered to be within IC design but has no functional purpose.

Figure 4:
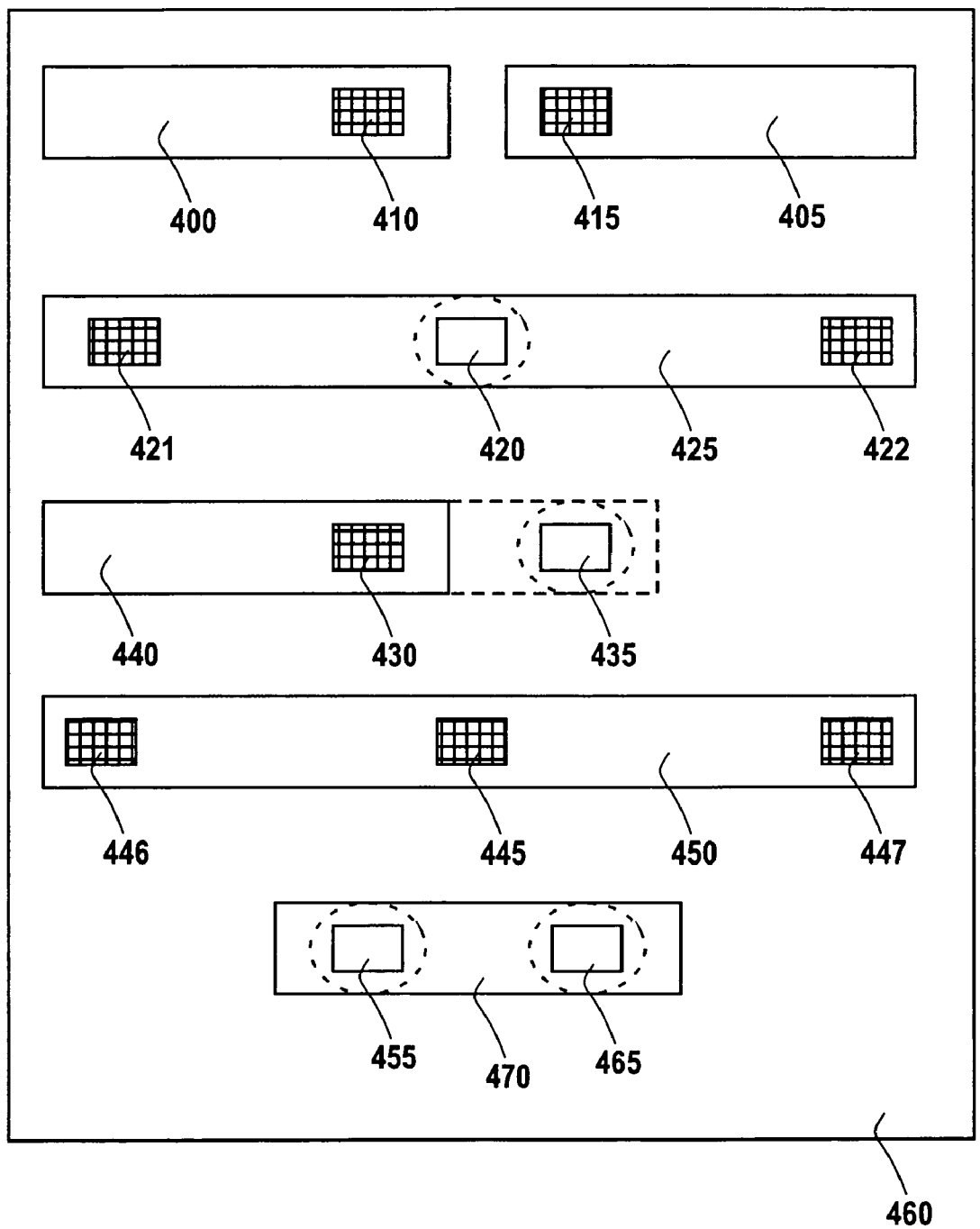
FIG. 4, meant to be illustrative and not limiting, illustrates a top view of a metal routing and via layer that have undergone the method reflected in FIG. 2 in accordance with one embodiment of the invention.

FIG. 4, meant to be illustrative and not limiting, illustrates a top view of a metal routing and via layer as designed by the method mentioned in FIG. 2. Different metal routing and via designs are within an IC design layer 460. Vias 410, 415, 421, 422, 430, 445, 446 and 447 are used for routing signals. Vias 420, 435, 455 and 465 are not utilized for routing signals for the second IC design. The metal routing 400 and 405 are generated by the P&R software to provide a signal path routed to the via 410 and via 415, respectively. A metal routing 425 provides a signal routing path from the via 421 to the via 422. However, the via 420 is in the routing path between the via 421 and the via 422 along the metal routing 425. If the method described in the FIG. 2 is not utilized, the P&R software considers the via 420 as a blockage and reroutes the metal routings in a non-optimized manner for the signal path between the via 421 and the via 422. The non-optimized metal routing may utilize (i) an additional metal and/or via layers or (ii) additional metal layer area, for designing the signal path connecting the via 421 and the via 422. Utilizing additional layers or area incurs higher manufacturing cost because more IC mask redesigns are required. The metal routing 440 provides a signal path to the via 430. The adjacent route technique places the metal routing in one of two ways. In one embodiment, the adjacent port technique places the metal routing within a close proximity to the identified port but not connecting to the identified port as illustrated by the metal routing 440 connecting to the via 430 and not the via 435. In another embodiment, the adjacent route technique places the metal routing over the identified port connecting the identified port as illustrated by the broken lines of the metal routing 440 connecting to the via 430 and the via 435. The vias 445,446 and 447 are connected through metal routing 450. The via 455 and via 465 are connected using an island port metal routing 470 where the via 455 and via 465 are surrounded by metal. The island port metal routing technique does not provide connections to input or output (IOs) signals. The island port metal routing provides one example of a dummy structure within the IC designs. In one embodiment, the via placement is symmetrical to an axis within the IC design. The symmetrical design is inherent from programmable IC design whereby multiple blocks of repetitive programmable units, such as Look-Up-Tables (LUTs), makes up the entire programmable IC design. In another embodiment, the IC design has a fixed layer of vias. As the via placements are fixed in this embodiment, modifying a design from the programmable IC design to the non-programmable IC design creates identical via placements across both designs.

Figure 5A:
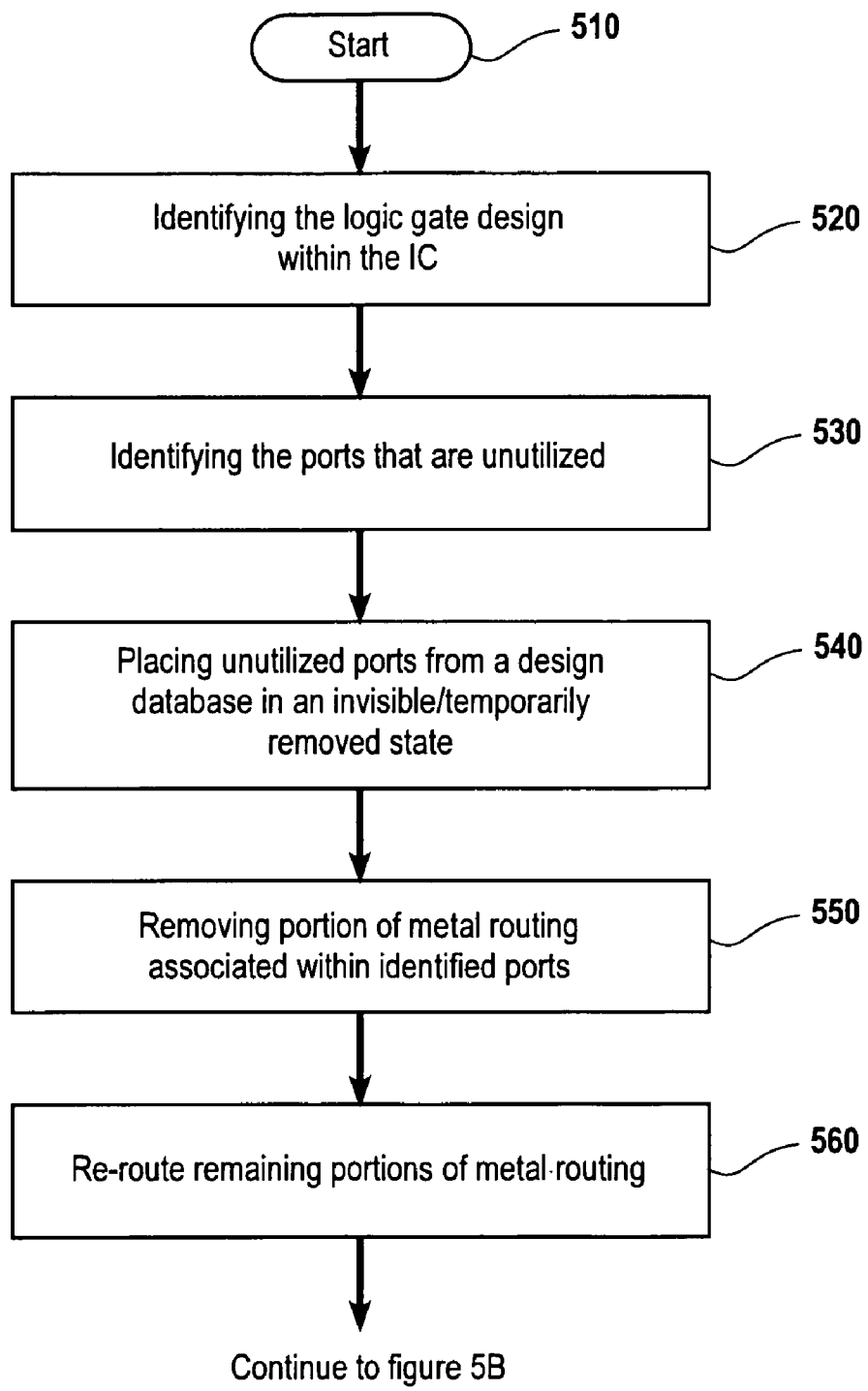
FIGS. 5A and 5B, meant to be illustrative and not limiting, are flowchart diagrams illustrating a method of rerouting a portion of a metal layer of a first IC design for migration to a second IC design in accordance with one embodiment of the invention.

FIG. 5A, meant to be illustrative and not limiting, illustrates a method of rerouting a portion of a metal layer of a first IC design during the migration to a second IC design. The method starts by identifying a specific logic design within an IC design as shown in operation 520. The specific logic design is a planned design to be inserted within the second IC design. Once the logic design is determined, ports unutilized in signal routing for the specific logic designs within the first IC design are identified as in operation 530. In one embodiment the term port refers to interconnections which provide a pathway for routing signals. A typical example of the port could either be a via or a via-port. The identified port is then placed into an invisible state or a temporarily removed state as in operation 540. Then a portion of metal routings associated with the identified port is removed as in operation 550. It should be appreciated, that both the operation 540 and 550 enables the P&R software to be freed from considering unnecessary blockages during the metal rerouting. The remaining portions of metal routing are then rerouted by utilizing the P&R software as shown in operation 560.

Figure 5B:
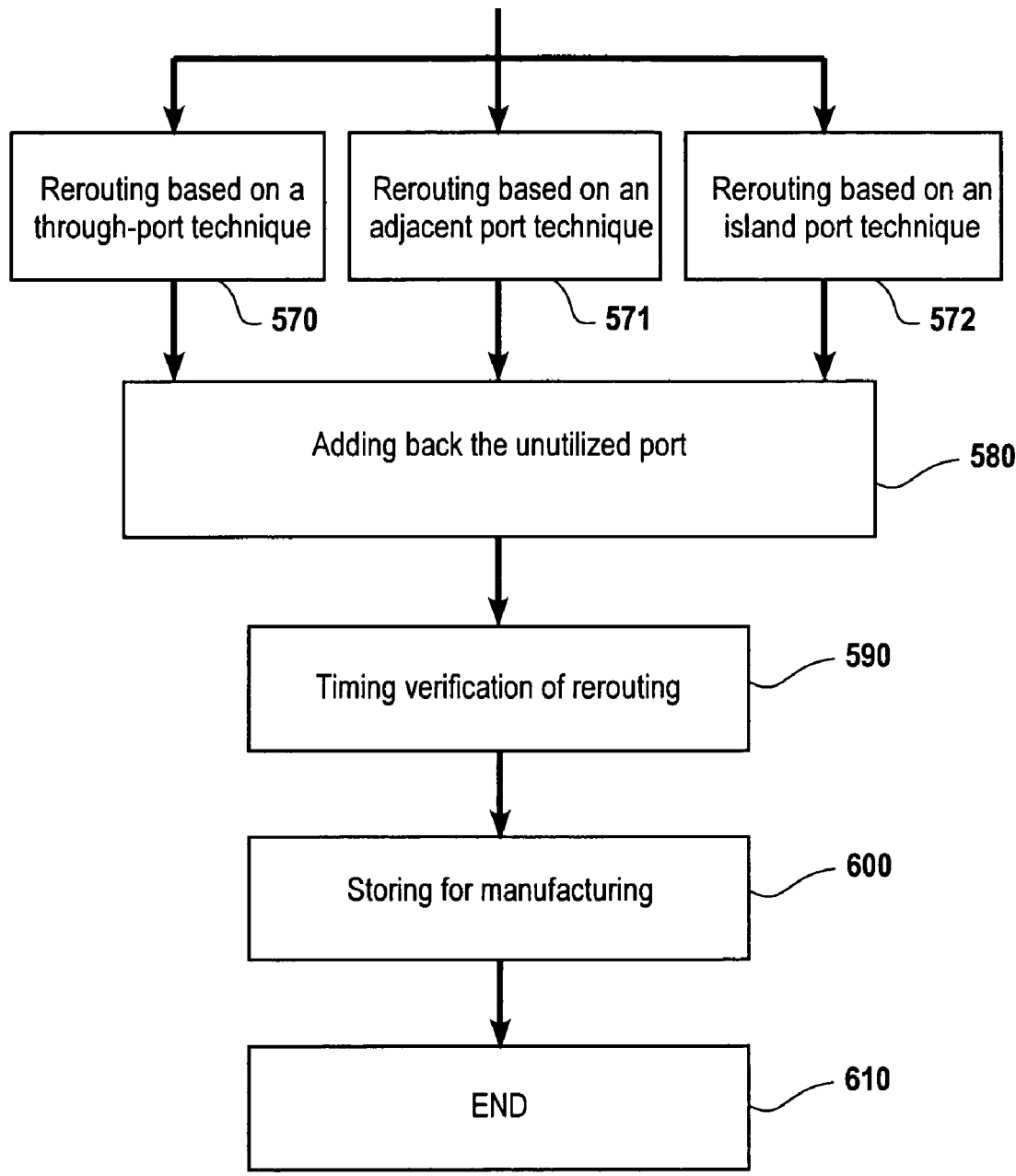

FIG. 5B, meant to be illustrative and not limiting, illustrates the continuation of the method from FIG. 5A. The rerouting of the remaining portions of metal routings utilizes one of three different techniques. In one embodiment, the rerouting utilizes a route-through technique as specified in operation 570. The route-through technique is utilized when the identified port is in between two other ports. The route through techniques is illustrated by the metal routing 425 connecting the via 421 and the via 422 by routing through the via 420 in FIG. 4. In another embodiment, the rerouting of FIG. 5B utilizes an adjacent route technique. The adjacent route technique is utilized when the metal routing design connects to a port that has the identified port within a close proximity to the metal routing as specified in operation 571. The adjacent route technique places the metal routing in one of two ways. In one embodiment, the adjacent port technique places the metal routing within a close proximity to the identified port but not connecting to the identified port as illustrated by the metal routing 440 connecting to the via 430 and not the via 435 within FIG. 4. In another embodiment, the adjacent route technique places the metal routing over the identified port connecting the identified port as illustrated by the broken lines of the metal routing 440 connecting to the via 430 and the via 435 in FIG. 4. In one embodiment, the term within close proximity refers to distances where signal interference occurs. In another embodiment, the rerouting is utilizing an island-port technique as specified in operation 572. The technique is utilized when an identified port is not within a close proximity of a port that is utilized for routing signals and the identified port is not in between a signal path that connects at least two ports. The island port technique places a metal in an island like design to over the identified port as illustrated by the vias 455, 465 and the metal routing 470 in FIG. 4. The metal routings utilizing the route-through technique or the adjacent port technique is verified for timing consistency. This ensures the logic design is within an expected timing target range after the addition or reduction of the metal routings. Prior to the timing verification, the identified port that was placed in the invisible state or the temporarily removed state is placed back into the IC design as specified in operation 580. The timing verification of the design is conducted with the identified port not invisible or temporarily removed as specified in operation 590. The design is stored for manufacturing purposes in operation 600.

Figure 6A:
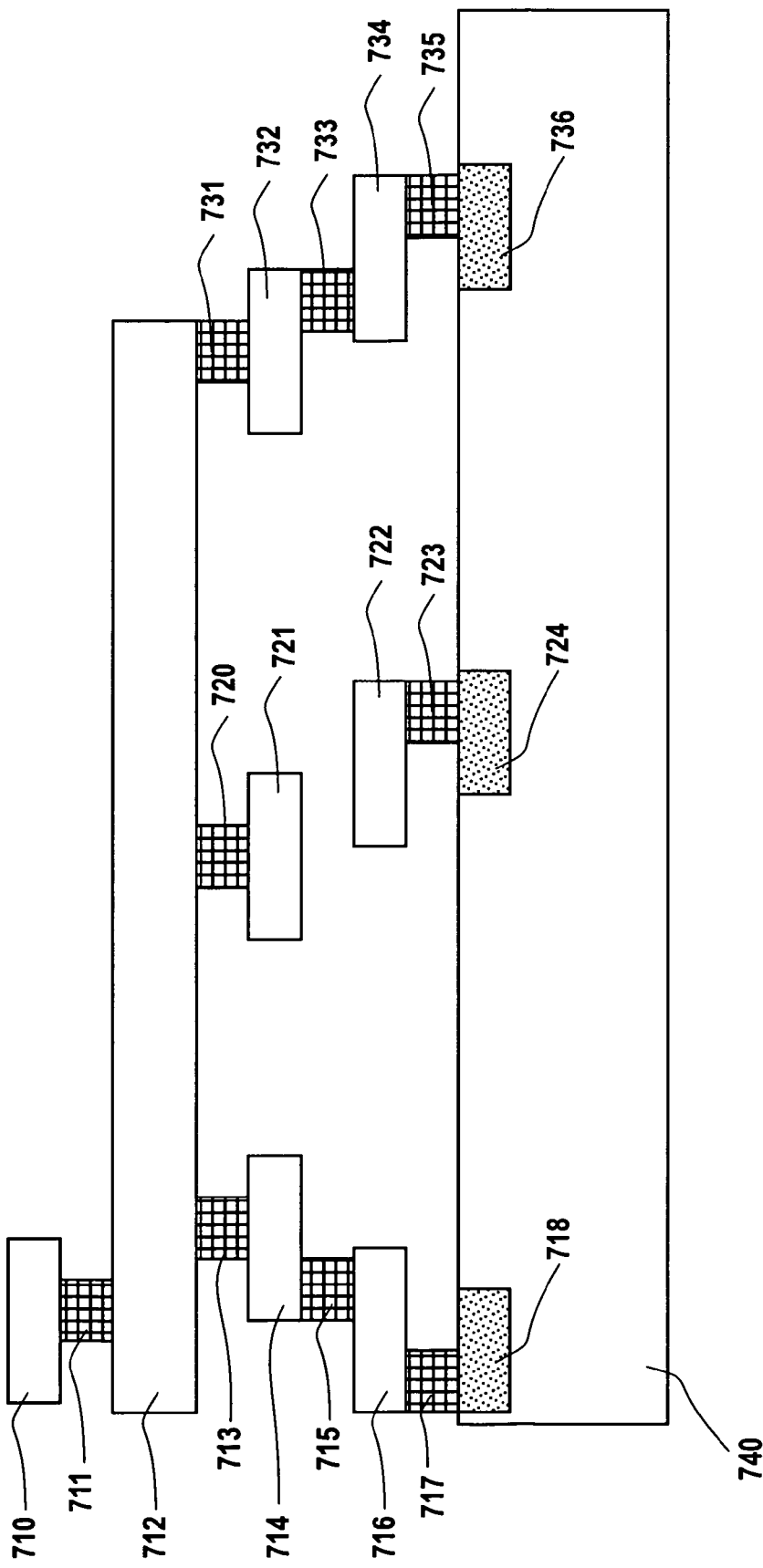
FIG. 6A, meant to be illustrative and not limiting, illustrates a cross-sectional view of an IC with metal routings after utilizing the route-through technique in accordance with one embodiment of the invention.

FIG. 6A, meant to be illustrative and not limiting, illustrates a cross-sectional view of an IC design after utilizing the route-through technique. A metal routing 710 and 712 are located in upper metal layers. Metal routings 714, 716, 721, 722, 732, and 734 are located in the bottom metal layer. Interconnecting vias such as vias 711, 713, 720, 715, 717, 723, 731, 733, and 735 provide connections from a metal routing in a metal layer to another metal routing from a different metal layer or a metal routing to a transistor structure 718, 724 or 736 within a substrate 740. The metal routing 712 and the vias 715, 733 are in customization layers. Based on a logic design, the via 720 and the metal routing 721 is not utilized for signal routing. To provide a signal path from the metal routing 710 to the via 731, the route-through technique design is utilized. Hence, the metal routing 712 is routed through the via 720 to provide the signal path.

Figure 6B:
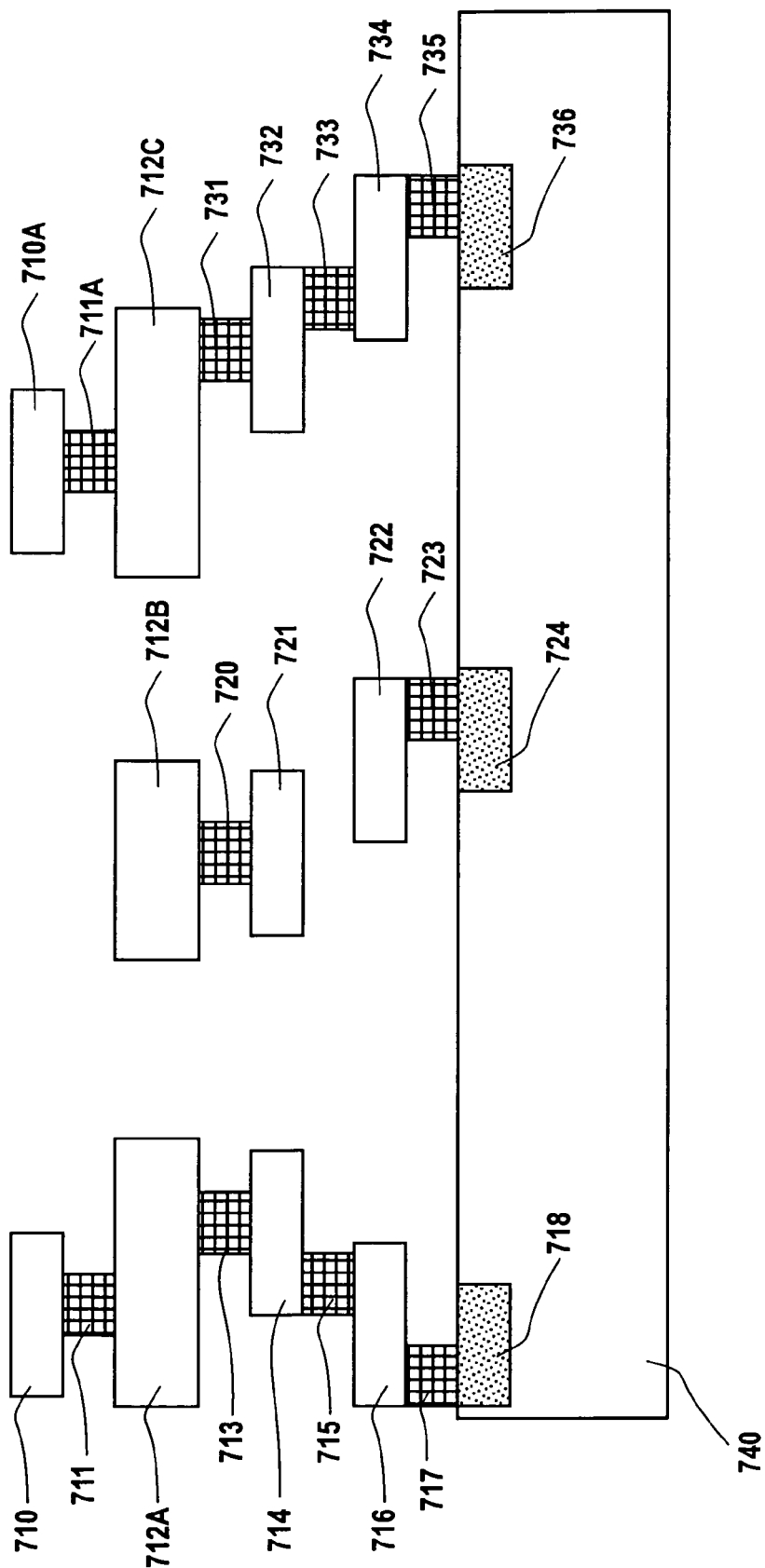
FIG. 6B, meant to be illustrative and not limiting, illustrates a cross-sectional view of an IC with the metal routings after utilizing the island port technique in accordance with one embodiment of the invention.

FIG. 6B, meant to be illustrative and not limiting, illustrates a cross-sectional view of the IC utilizing the island-port technique. The metal routings and the vias are identical as in FIG. 6A, with the noted exception mentioned below. The difference is in the metal routing 712A, 712B and 712C. The island port technique is used when the via 713 and the via 731 are not within a close proximity to the via 720, which is the via unutilized for routing signals. The outcome of the island port technique is shown through a dummy like structure made from the metal routing 712B, the via 720 and the metal routing 721. As the name of the technique illustrates, the manner in which the metal routing 712B is laid out provides an island like structure and is not connected to any other signal path.

Figure 6C:
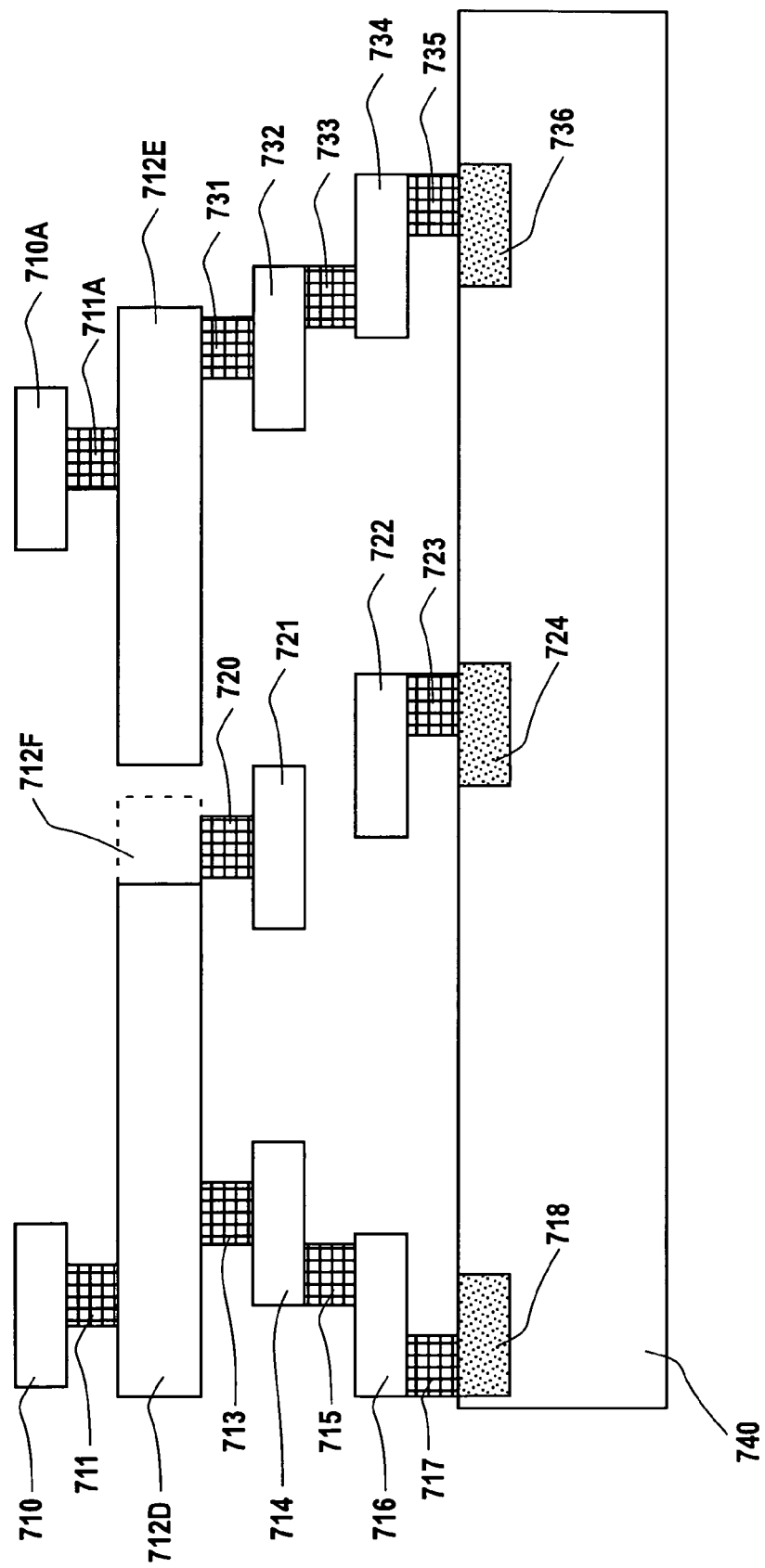
FIG. 6C, meant to be illustrative and not limiting, illustrates a cross-sectional view of an IC with the metal routings after utilizing the adjacent route technique in accordance with one embodiment of the invention.

FIG. 6C, meant to be illustrative and not limiting, illustrates a cross-sectional view of the IC utilizing the adjacent port technique. The metal routings and vias are identical as in FIG. 6A, with the noted exception mentioned below. The adjacent port technique is utilized when the via 713 and the via 731 are within a close proximity to the via 720, which is not utilized for routing signals. The difference is observed with the metal routing 712D and 712F. In one embodiment, the metal routing 712D is laid out all the way to the via 720 but does not provide a connections to the via 720. In another embodiment, the metal routing 712F is connecting metal routing 712D to the via 720. The metal routing 712F is routed through the via 720. Metal routings 712D and 712E are in close proximity to the via 720, hence, the technique is referred to as the adjacent port technique. The via 720 is either left uncovered by any metal routing or is covered by the adjacent metal routings.

The embodiments, thus far, were described with respect to integrated circuits. The method and apparatus described herein may be incorporated into any suitable circuit. For example, the method and apparatus may be incorporated into numerous types of devices such as microprocessor or programmable logic devices. Exemplary of programmable logic devices include programmable arrays logic(PALs), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just name a few.

The programmable logic device described herein may be part of a data processing system that includes one or more of the following components; a processor; memory; IO circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method of operations were described in a specific order, it should be understood that other operation may be performed in between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing invention has been described in some detail for the purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method to modify a first integrated circuit (IC) design into a second integrated circuit (IC) design, the first and second IC designs specifying a common interconnection layer having a plurality of interconnections, the method comprising:
    identifying an interconnection from among the plurality of interconnections that is unused for routing signals in the first IC design;
    removing from the first IC design a metal layer that is coupled with the identified interconnection to generate a modified design;
    placing the identified interconnection of the first IC design in one of an invisible state or a temporarily removed state in the modified design;
    routing the metal layer in the modified design, which alters the modified design; and
    storing the modified design as the second IC design, wherein each method operation is executed by a processor.

2. The method in claim 1 wherein placing the identified interconnection into one of the invisible state or temporarily removed state avoids a routing blockage of the first IC design when routing the metal layer in the modified IC design.

3. The method in claim 1 wherein identifying the interconnection is based on a logic gate design in the second IC design.

4. The method in claim 1 wherein the routing further comprises routing the metal layer utilizing one of route-through, adjacent route, or island techniques.

5. The method in claim 1 further comprising:
    instantiating the identified interconnection during timing performance verification for the second IC design.

6. The method in claim 1 wherein the interconnection is one of a via, a port or a via-port and wherein a number of the plurality of interconnections within the first and the second designs are equal.

7. The method in claim 1 wherein the metal layer is in a customizable layer of the first IC design and the first IC design is for a programmable logic device.

8. The method in claim 1 wherein the first IC design is for a programmable IC design and the second IC design is for a non-programmable IC design.

9. A method to migrate between integrated circuit (IC) designs, wherein each of the IC designs has an equal number of fixed ports, the method comprising:
    identifying a routing path in a metal layer for a gate design within one of the IC designs;
    identifying an unutilized interconnection associated with one of the fixed ports that is blocking the routing path;
    placing the unutilized interconnection into one of an invisible state or temporarily removed state in another one of the IC designs;
    removing a portion of the metal layer that is coupled directly with the unutilized interconnection in the another one of the IC designs; and
    rerouting remaining portion of the metal layer while maintaining unutilized interconnections in the IC designs, wherein each method operation is executed by a processor.

10. The method in claim 9 wherein the unutilized interconnection within the IC is one of via, a port or a via-port.

11. The method in claim 9 wherein the rerouting the remaining portion of the metal layer utilizes one of route-through, adjacent route, or island techniques 12. The method in claim 9 further comprising:
    instantiating the unutilized interconnection when performing timing analysis.

13. The method in claim 9, wherein the IC design has a symmetrical distribution of interconnections in a layer of the fixed ports.

14. The method in claim 9 wherein the metal in the metal layer is in a customizable layer of the IC.

15. A method of rerouting a portion of a metal layer in a first integrated circuit (IC) design when migrating to a second IC design, the method comprising:
    identifying a via that is not used for routing signals in the first IC design;
    removing from the first IC design the portion of the metal layer associated with the identified via to create a modified design;
    placing the identified via of the first IC design in one of an invisible state or a temporarily removed state in the modified design;
    rerouting remaining portion of the metal layer to avoid routing blockages associated with the identified via in the first IC design; and
    storing the modified design as the second IC design, wherein each method operation is executed by a processor.

16. The method in claim 15 wherein an amount of vias of a layer including the via is fixed between the first IC design and the second IC design.

17. The method in claim 15 wherein the rerouting minimizes a number of masks required for fabricating the design.

18. The method in claim 15 wherein the metal layer is in a customizable metal layer of a programmable logic device.

19. The method in claim 15 further comprising:
    instantiating the via with the rerouted remaining portion of the metal layer when performing a timing analysis.

20. The method in claim 15 wherein the rerouting of the remaining portion of the metal layer utilizes one of route-through, adjacent route, or island port techniques.

21. The method in claim 15 wherein the first IC design is a programmable IC and the second IC design is a non-programmable IC.

* * * * *